United States Patent [19]

Sugasawara et al.

[11] Patent Number: 5,953,518
[45] Date of Patent: Sep. 14, 1999

[54] YIELD IMPROVEMENT TECHNIQUES THROUGH LAYOUT OPTIMIZATION

[75] Inventors: Emery O. Sugasawara, Pleasanton; Sudhakar R. Gouravaram, Fremont; Mandar M. Dange, Milpitas, all of Calif.

[73] Assignee: LSI Logic Corporation, Milpitas, Calif.

[21] Appl. No.: 08/818,640

[22] Filed: Mar. 14, 1997

[51] Int. Cl.$^6$ .............................. G06F 17/50; G06F 11/00
[52] U.S. Cl. ................ 395/500.11; 382/149; 395/183.13
[58] Field of Search .................................... 364/488–491, 364/578; 382/149; 395/183.01, 183.13

[56] References Cited

U.S. PATENT DOCUMENTS

| | | | |
|---|---|---|---|
| 4,500,963 | 2/1985 | Smith et al. | 364/300 |
| 4,700,317 | 10/1987 | Watanabe | 364/488 |
| 4,815,003 | 3/1989 | Putatunda et al. | 364/491 |
| 5,062,054 | 10/1991 | Kawakami et al. | 364/491 |
| 5,200,908 | 4/1993 | Date et al. | 364/491 |
| 5,231,590 | 7/1993 | Kumar et al. | 364/491 |
| 5,307,286 | 4/1994 | Rusu et al. | 988/468 |
| 5,311,246 | 5/1994 | Warner et al. | 355/40 |
| 5,331,572 | 7/1994 | Takahashi | 364/491 |
| 5,365,454 | 11/1994 | Nakagawa et al. | 364/491 |
| 5,420,800 | 5/1995 | Fukui | 364/491 |
| 5,422,317 | 6/1995 | Hua et al. | 437/250 |
| 5,521,836 | 5/1996 | Hartoog et al. | 364/491 |
| 5,530,372 | 6/1996 | Lee et al. | 324/758 |
| 5,535,134 | 7/1996 | Cohn et al. | 364/491 |
| 5,663,891 | 9/1997 | Bamji et al. | 364/490 |

OTHER PUBLICATIONS

Allan et al. ("Eye: a tool for measuring the defect sensitivity of IC layout", IEE Colloquium on Improving the Efficiency of IC Manufacturing Technology, Jan. 1995, pp. 5/1–5–4), Jan. 1995.

Chiluvuri et al. ("Layout–synthesis techniques for yield enhancement", IEEE Transactions on Semiconductor Manufacturing, vol. 8, No. 2, May 1995, pp. 178–187), May 1995.

Karri et al. ("Simulated annealing based yield enhancement of layouts", Proceedings of Fourth Great Lakes Symposium on Design Automation of High Performance VLSI Systems, Mar. 4, 1994, pp. 166–169).

Maldonado et al. ("A post–processing algorithm for short–circuit defect sensitivity reduction in VLSI layouts", Proceedings of Seventh Annual IEEE International Conference on Wafer Scale Integration, Jan. 18, 1995, pp. 288–297).

Pineda de Gyvez ("Laser: a LAyout sensitivity exploreR—report and user's manual", Eindhoven University of Technology, Netherlands, NTIS, Mar. 1989).

Pineda de Gyvez et al. ("Systematic extraction of critical areas from IC layouts", Proceedings of the International Workshop on Defect and Fault Tolerance in VLSI Systems, Jan. 01, 1990, pp. 47–62).

Wagner et al. ("An interactive VLSI CAD tool for yield estimation", IEEE Transactions on Semiconductor Manufacturing, vol. 8, No. 2, May 1995, pp. 130–138).

*Primary Examiner*—Kevin J. Teska
*Assistant Examiner*—Phallaka Kik
*Attorney, Agent, or Firm*—Beyer & Weaver, LLP

[57] ABSTRACT

A process for optimizing the layout of an integrated circuit (IC) design is described. The optimization process includes selecting a segment of a conductive line to be modified. The segment is selected based upon its location between a first line and a second line and is separated from these lines by unequal distances, such that the segment is close enough to the first line such that a sensitive area that is susceptible to damage from particle contamination exists. The process also includes repositioning the selected segment such that the distance between the segment and the first line is increased and the distance between the segment and the second line is decreased.

31 Claims, 5 Drawing Sheets

Conventional Critical Path Layout

Modified Critical Path Layout

YIELD IMPROVEMENT TECHNIQUES THROUGH LAYOUT OPTIMIZATION

BACKGROUND OF THE INVENTION

The present invention relates to optimizing the layout of conductive lines in an integrated circuit (IC) chip. More particularly, the present invention relates to algorithms for optimizing layout of conductive lines to minimize the occurrence of sensitive areas that are susceptible to defects from particles.

During IC fabrication, the IC is exposed to a number of particles or particle defects, which may come from workers in the fabrication facility, equipment or processing chemicals employed during the fabrication process, etc. The particles typically range from about 0.1 micrometers ($\mu$m) to about 10 micrometers ($\mu$m) in size. With each new generation of ICs, the device feature size decreases, thereby increasing the susceptibility of the IC to defects from still smaller particles. While improvements in clean room technology reduce the average particle size in critical fabrication facilities, some damaging particles always can be expected to be present. Today's ICs, which include semiconductor devices that have feature sizes of about 0.3 $\mu$m, for example, are vulnerable to submicron sized particles. Such particles can short the closely spaced conductive lines in the IC circuitry due to today's small line widths and line separations.

FIG. 1A shows an idealized simple layout of a conventional IC design 10 that includes logic cells and conductive lines. A region of interest 11 has a conductive line 12, which provides an input signal "A" to cells 16 and 18 that generate output signals "C" and "D," which are transmitted through conductive lines 22 and 24, respectively. Similarly, region 11 includes another conductive line 14, which provides another input signal "B" to cell 20 that generates an output signal "E," which is transmitted through conductive line 26. These conductive lines typically include polysilicon or a metal. It should be understood that in actual designs, some or all elements of the logic cells may exist at layers other than the layer on which the conductive lines exist.

In many conventional wiring layout tools, the routing of conductive line 26 is always chosen to minimize delay, unless timing requires that a particular signal be slightly delayed. This overriding focus on minimizing delay (and shortening wire length) can inadvertently create regions susceptible to particle defects. Conductive line 26, as shown in FIG. 1A, is close enough to conductive line 24 to form an area that is sensitive to a particle, i.e. a particle 28, which is present in this area and in physical contact with conductive lines 26 and 24 may short-circuit output signals D and E. Such an area is hereinafter referred to as a "sensitive area." If conductive lines 26 and/or 24 represent a critical path, particle 28 is likely to render the entire design 10 inoperable and may be referred to as a "killer defect."

Particle 28, shown in FIG. 1A, may be introduced into the IC during the various stages of IC fabrication. By way of example, particle 28 may be introduced before or after the conductive lines have been formed. Before the conductive lines are formed, for example, a particle present on a blanket deposited photoresist layer, which overlies the metallization layer, prevents a part of the photoresist layer that is underlying the particle from being exposed to a light source. As a result, before the metallization layer is etched to form conductive lines, a photoresist mask is not developed in that part of the photoresist layer and that part of the metallization layer remains unetched. Unfortunately, the unetched part of the metallization may undesirably connects two conductive lines rendering the IC inoperable. One skilled in the art may also appreciate that such particles also pose a risk of creating a short-circuit between two conductive lines at different levels of metallization.

FIG. 1B shows a more detailed view of conductive lines having sensitive areas in a layout scheme of another conventional IC design 50. Sensitive areas 52, 54 56 and 58, for example, are manifested as sharp corners of conductive lines that are positioned close to adjacent conductive lines, as shown. The presence of a particle in these sensitive areas would be detrimental to the IC performance as described above.

The layout design of IC devices, such as metal oxide semiconductor (MOS) transistors, and circuits is constrained by a set of rules called the "design rules." These rules are technology specific and specify minimum sizes, spaces and overlaps for the various features (e.g. lines) that define the IC device. Processes are designed around a minimum feature size, which is the width of the smallest line or space that can be reliably transferred to the surface of the wafer using a given generation of lithography.

While design rules for automatic placement of conductive lines provide a minimum separation distance, they do not account for the general need to arrange the conductive lines in such a manner so that the sensitive areas are minimized. The design rules that dictate the conventional IC layout, are guided only by the criteria of minimizing overall chip size and maximizing performance. By way of example, these criteria may be accomplished by making sure that a conductive line does not take a circuitous path or takes the shortest distance between two contact points, e.g., cells or logic gates. Unfortunately, because conventional design criteria do not account for the sensitive areas, IC yield is unduly low.

What is needed is a method that optimizes a layout of conductive lines in an integrated circuit (IC) chip, such that sensitive areas that are susceptible to defects are minimized without increasing the overall size of the IC or detrimentally affecting the performance of the IC design.

SUMMARY OF THE INVENTION

To achieve the foregoing, one aspect of the present invention provides a process for optimizing the layout of an integrated circuit (IC) design. The optimization process includes selecting a segment of a conductive line to be modified. The segment is selected based upon its location between a first line and a second line and is separated from these lines by unequal distances, such that the segment is close enough to the first line such that a sensitive area that is susceptible to damage from particle contamination exists. The process also includes repositioning the selected segment such that the distance between the segment and the first line is increased and the distance between the segment and the second line is decreased.

In the optimization process, the step of selecting may include measuring the distance between the segment and the first line and determining whether that distance is less than or equal to a predefined gap differential. The step of modifying in the optimization process may further include: determining the distances between the segment and the first and second lines; determining an absolute value of a difference between the distances; and reconfiguring the magnitude of the distances if the absolute value of the difference between the gap distances is greater than or equal to a predefined gap differential. In the above mentioned step of modifying, the step of reconfiguring may include reducing the magnitude of larger of the distances by a factor that is one half of the absolute value of the difference between the distances. Reconfiguring the magnitude of the distances may ensure that the distances are substantially equal to each other. The predefined gap differential may vary depending on the technology used. The predefined gap differential, for example, may range from between about 0.25 $\mu$m and about 2.0 $\mu$m. In one preferred embodiment of the present invention, the predefined gap differential may range from between about 0.35 $\mu$m and about 2.0 $\mu$m.

In the optimization process described above, the selected segment of the conductive line may be part of a critical path and the step of repositioning may include modifying the critical path such that there is no signal delay. In one embodiment, the optimization process of the present invention may be carried out in a separate step after a general layout of conductive lines is determined by a routing tool. Alternatively, in another embodiment, the optimization process is carried out by the routing tool when a general layout of conductive lines is determined.

The optimization process of the present invention may further include a step of post-layout simulation to verify the design after optimization of conductive lines has concluded. The selected segment may form part of a corner and after the step of modification the segment may no longer form part of a corner. In one embodiment of the present invention, the selected segment of the conductive line is part of an intercell conductive layout scheme. Alternatively, in another embodiment of the present invention, the selected segment of the conductive line is part of an intracell conductive layout scheme. The steps of selecting and repositioning may be executed in succession for a plurality of line segments located throughout the entire integrated circuit (IC) design. The entire IC design may be subjected to the steps of selecting and repositioning at least twice.

In another aspect, the present invention provides another process of optimization. This process of optimization includes selecting an IC feature to be modified. The IC feature is close enough to at least one adjacent IC feature such that a sensitive area that is susceptible to damage from particle contamination exists. This process of optimization also includes repositioning the selected IC feature or the adjacent IC feature such that at least one gap distance between the selected IC feature and at least one adjacent IC feature is reconfigured to eliminate the sensitive area.

The step of repositioning may include reconfiguring at least one gap distance to eliminate the sensitive area such that an overall size of the IC does not increase. The step may also include increasing at least one gap distance to eliminate the sensitive area. In one embodiment of the present invention, the step of repositioning may include measuring at least one gap distance and then reconfiguring the gap distance, if the gap distance is greater than or equal to a predefined minimum gap differential. In another embodiment of the present invention, the step of repositioning may include measuring a first gap distance between the selected IC feature and a first adjacent IC feature and then increasing the first gap distance if the first gap distance is greater than or equal to a predefined minimum gap distance. The selected IC feature may include a segment of conductive line or a cell.

In yet another aspect, the present invention provides an apparatus for optimizing a layout of an IC design. The apparatus includes a routing tool to generate the layout scheme of IC features, which has at least one IC feature that is close enough to at least one adjacent IC feature such that a sensitive area that is susceptible to damage from particle contamination exists, and an optimizing tool to generate a modified layout scheme, in which at least one IC feature or at least one adjacent IC feature is repositioned such that at least one gap distance between at least one IC feature and at least one adjacent IC feature is reconfigured to eliminate the sensitive areas. The apparatus may further include a post-layout simulator tool to verify the modified layout scheme. The optimizing tool may be a software tool. The routing tool may generate the layout scheme of the IC features based on a schematic generated by a design capture tool. The apparatus may further include a pre-layout simulator tool to verify whether the schematic generated by the design capture tool will perform as intended. The routing tool and the optimizing tool may be incorporated in a single tool.

In yet another aspect, the present invention provides another apparatus for optimizing a layout scheme of an IC design. This apparatus includes means for routing to generate the layout scheme of IC features, which has at least one IC feature that is close enough to at least one adjacent IC feature such that a sensitive area that is susceptible to damage from particle contamination exists, and means for optimizing to generate a modified layout scheme, in which at least one IC feature or at least one adjacent IC feature is repositioned such that at least one gap distance between at least one IC feature and at least one adjacent IC feature is reconfigured to eliminate the sensitive area.

The means for optimizing may include a software tool. The means for routing and the means for optimizing, according to one embodiment of the present invention, may be incorporated into one tool. The apparatus may further include a means for post-layout simulation to verify the modified layout scheme. The means for routing may generate the layout scheme of IC features based on a schematic generated by a design capture tool.

These and other features of the present invention will be described in more detail below in the detailed description of the invention and in conjunction with the following figures.

DETAILED DESCRIPTION OF THE PREFERRED EMBODIMENTS

The present invention provides a method for optimizing the routing of conductive lines such that the number of sensitive areas that are susceptible to particles is minimized. In the following description, numerous specific details are set forth in order to provide a thorough understanding of the present invention. It will be apparent, however, to one skilled in the art that the present invention may be practiced without limitation to some or all of these specific details.

Figure 2:
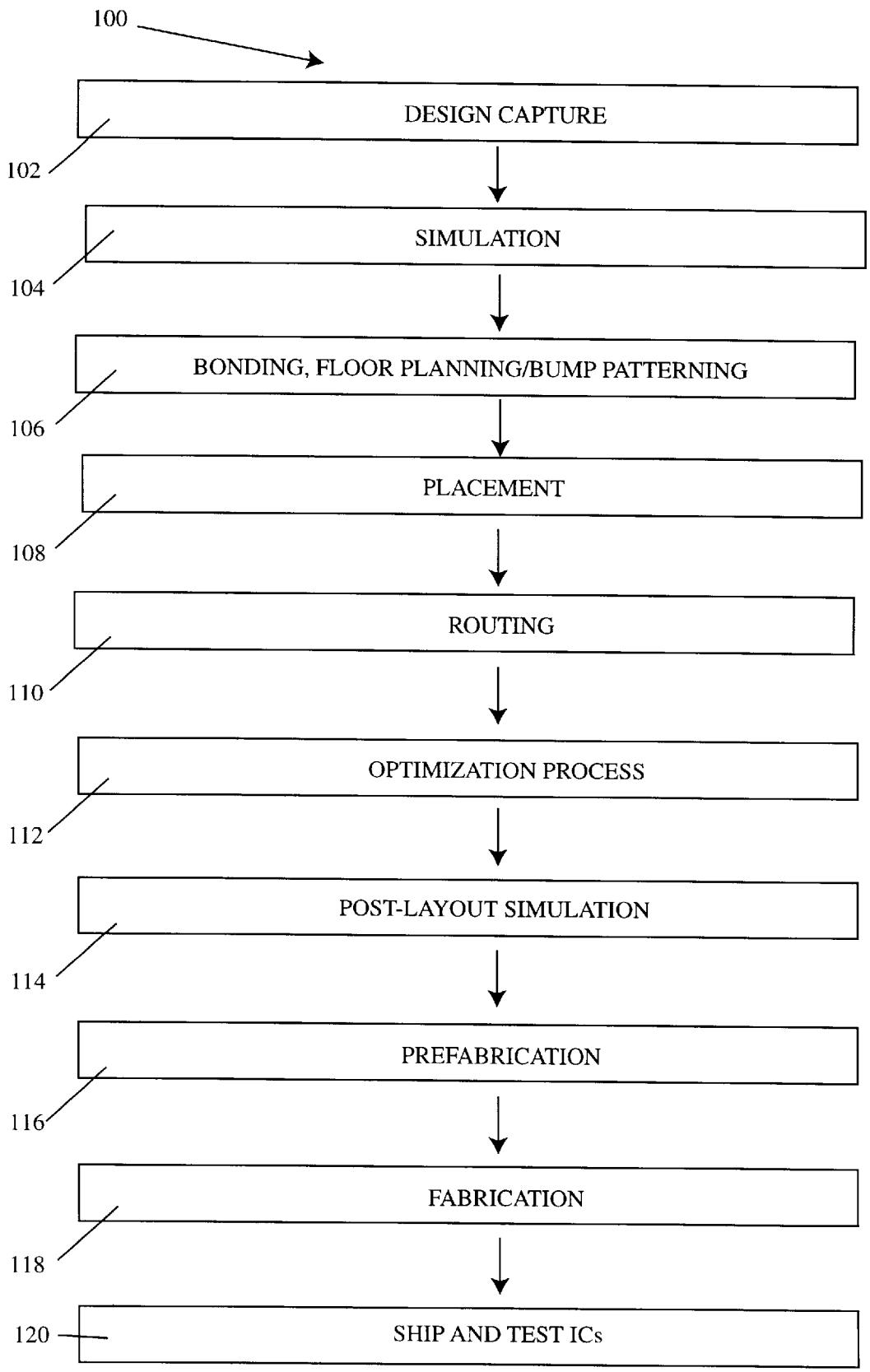
FIG. 2 shows one conventional process flow for designing an IC, which flow is modified to incorporate an inventive step of optimizing the routing of conductive lines to minimize the sensitive areas that are susceptible to particles.

FIG. 2 shows one conventional design process 100 to implement a circuit design on an integrated circuit (IC) and that, according to one embodiment, incorporates the inventive step of optimizing the routing of conductive lines such that the number of sensitive areas are minimized. Design process 100 begins at a step 102 where information from a hardware design language, for example, is input into a design capture tool to produce a "netlist," which represents a functional description of a schematic design of the IC. The design capture tool, by way of example, can be a simple graphic schematic creator, a high level design layout synthesis or any other netlist capture tool.

In a step 104, a simulation tool or a "pre-layout simulator" verifies whether the schematic of step 102 will perform as intended. Next, in step 106 the various signal input and output locations of the IC are set and the actual layout of bond pads, bump patterns, etc. are defined. In a step 108 the entire IC is divided into blocks, e.g., central processing unit (CPU), memory, multiplier, bus, etc. and the placement of the IC components, e.g. logic gates, that perform the appropriate function in those blocks is determined.

Next, in a step 110 a routing tool is employed to generate a layout scheme for the conductive lines. There are many different kinds of routing tools and the kind of routing tool that is employed depends on the kind of signal (e.g., a clock signal) that is to be routed. The routing tool develops the layout scheme for the conductive lines based on the schematic generated by the design capture tool of step 102. This layout scheme is, however, limited by some design constraints, i.e. certain conductive lines depending on their function have priority over others. Routing, for example, is divided into clock routing, critical nets, etc. As is well known in the art, some of this routing may define critical paths, which constitutes about 5 to 10% of the total routing in the IC.

In a step 112, a software tool, for example, is employed to optimize the routing of the conductive lines such that the number of sensitive areas that are susceptible to particles is minimized. In the embodiment shown, the optimization is carried out in a separate step from step 110. Alternatively, in another embodiment of the present invention, step 112 is combined with step 110 and the optimization is carried out with the routing tool employed in step 110. Still further, the optimization may be conducted together with a design rule checking step.

A "post-layout simulator" tool is employed in step 114 to verify the design after optimization of conductive lines has concluded. In step 116, prefabrication steps, such as network versus layout, design rule checking and e-beam fabrication of reticles, are performed. The network versus layout ensures that the schematic design of the IC in the netlist is actually implemented in the layout scheme. Prefabrication steps are followed by the actual fabrication of the ICs in step 118 and testing and shipping of the ICs in step 120.

Figure 3:
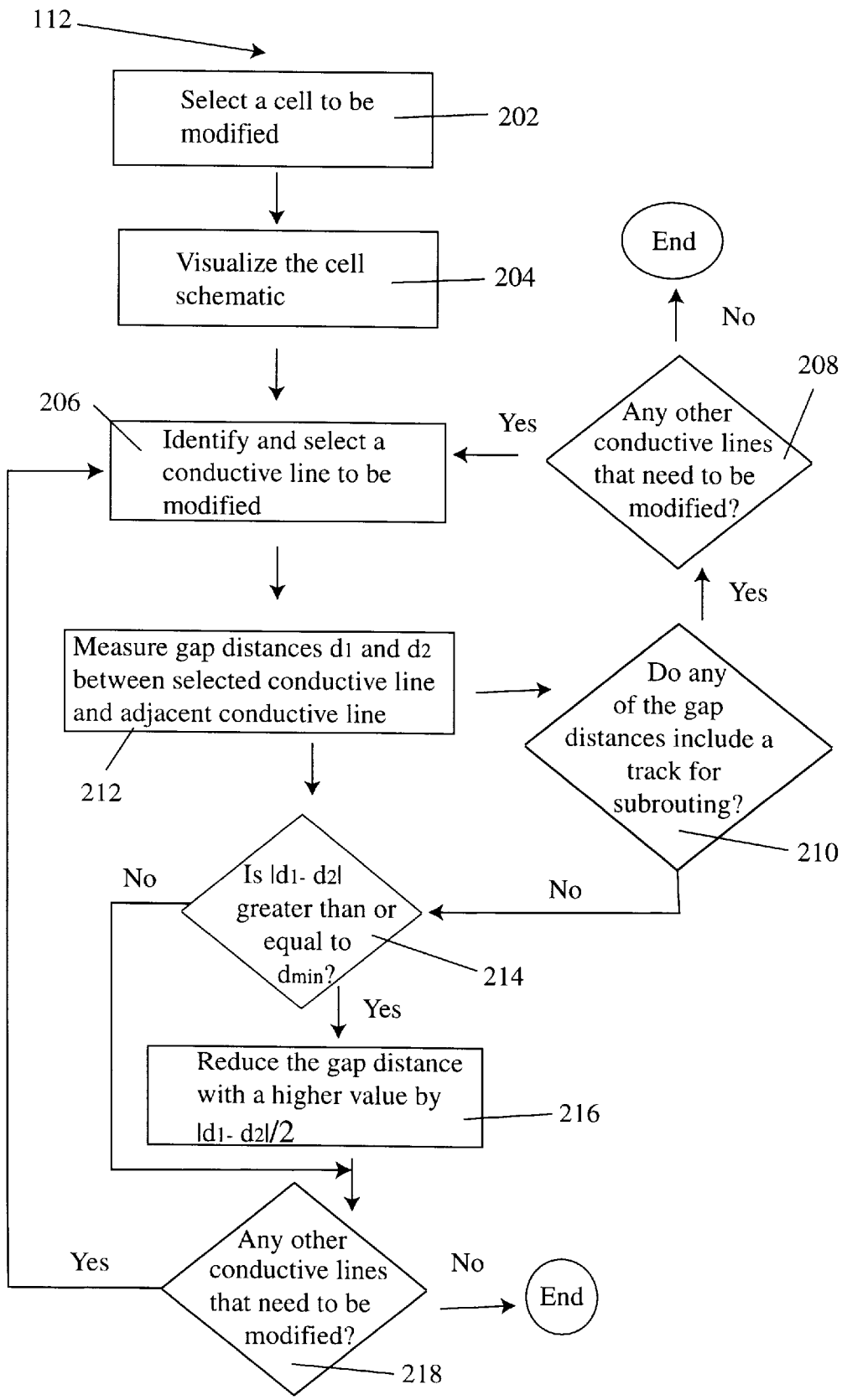
FIG. 3 shows one preferred embodiment of the inventive method of optimizing the routing scheme of the conductive lines in the present invention such that the number of sensitive areas that are susceptible to particles are minimized.

FIG. 3 shows one preferred embodiment of this invention's method of optimizing the routing of conductive lines such that the number of sensitive areas that are susceptible to short-circuiting by particles is minimized. This method may, for example, implement step 112 of FIG. 2. The inventive method 112 begins with a step 202, where the subject cell to be modified is identified and selected. Next, in a step 204 a graphic editor displays the schematic that is generated by the design capture tool of FIG. 2. In a step 206, a conductive line that should be modified is identified and selected. The conductive line selected in step 206 should preferably exclude any conductive line that is used for power and pin connections.

In step 212, the gap distances between the selected conductive line and conductive lines adjacent to the selected conductive line are measured. By way of example, if a selected conductive line has adjacent to it a first and a second conductive line, then according to step 212, a first gap distance (d1) between the selected conductive line and the first conductive line and a second gap distance (d2) between the selected conductive line and the second conductive line are measured. If only one conductive line is positioned adjacent to a selected conductive line, then only one gap distance is measured, i.e. the gap distance between the selected conductive line and its adjacent conductive line. In the embodiment of FIG. 3, this situation is not treated. However, in other embodiments, the lines may be separated by a defined distance if they are initially less than a specified distance apart. By way of example, in FIG. 1A, where conductive line 24 is the only conductive line shown adjacent to conductive line 26, the gap distance between conductive lines 24 and 26 may be widened if the gap is initially less than the specified distance.

In step 210, it is then determined whether the gap distance falls on a track that is reserved for subrouting, i.e. a routing track specifically provided for connecting two points, e.g., cells or gates. If it is determined that there is indeed, within any of the gaps, at least one track reserved for subrouting, then the process proceeds to step 208 where it is determined whether another conductive line might need to be modified. If not, i.e., all lines have been considered, the process is concluded. If, however, other lines remain to be evaluated, process control returns to step 206 where the next line of interest is selected.

It is important to note, however, the step 210 will not always be necessary and that its presence will depend on the particular IC design employed. In those applications where a subrouting is not necessary, the track will be considered as an area available for optimized routing and the process will automatically proceed to a step 214. That is, process control will transfer directly from step 212 to step 214, and steps 208 and 210 will be eliminated.

In step 214, it is determined whether the absolute value of the difference between the measured gap distances (d1–d2) is greater than or equal to a predefined value of a minimum gap differential ($\Delta d_{min}$), which can be a technology dependent value in one embodiment of the present invention. The minimum gap differential ($\Delta d_{min}$), for example, may range from between about 0.25 $\mu$m to about 2.0 $\mu$m, and in one preferred embodiment of the present invention may range from between about 0.35 $\mu$m to about 2.0 $\mu$m. In an alternative embodiment of the present invention, where there is only one conductive line reasonably close to the selected conductive line, e.g., selected conductive line 26 of FIG. 1A, it is determined whether the single gap distance is greater than or equal to a predefined value of a minimum gap. If it is determined in step 214 that the difference between the gap distances does not exceed the minimum predefined gap differential (or the single gap is greater than the "minimum gap"), the selected conductive line is not modified and optimization process 112 proceeds to step 218 where it is determined whether there are any other conductive lines that need to be modified.

If, however, it is determined in step 214 that the absolute value of the difference between the gap distances, (|d1−d2|), is equal to or greater than the predefined minimum gap differential, then, at a step 216, the gap distance with a higher value is reduced by a factor that is half of the difference between the gap distances (|d1−d2|/2). Other techniques may be employed to reduce the discrepancy in separation distances. In one embodiment of the present invention, step 214 may have the effect of reconfiguring the selected conductive line and its adjacent conductive lines such that the two gap distances are equal to each other.

The technique by which new lines are selected for evaluation (e.g., step 206) may take many forms. For example, the line routing design may be traversed in a rasterized fashion. The techniques by which line separation distances are measured and adjusted are well known in the field and are incorporated in conventional design rule checking software, for example.

In some embodiments, it will be desirable to iterate on the procedure of FIG. 3. For example, after one raster scan over all line segments in a design the relative separation distances of adjacent lines will have been modified. While this will reduce the danger of shorting across lines, further improvement may be realized by a second (or additional subsequent) iteration in which adjacent line segments are again compared and adjusted according to the procedure of FIG. 3. In one embodiment of the present invention, step 214 may have the effect of reconfiguring the selected conductive line and its adjacent conductive lines such that the two gap distances are equal to each other.

Suitable computers for use in implementing the present invention may be obtained from various vendors. In one preferred embodiment, an appropriately programmed HP735 workstation (Hewlett Packard, Palo Alto, Calif.) may be used to perform the steps associated with this invention. Various other computers, however, may be used depending upon the size and complexity of the design tasks. Suitable computers include mainframe computers such as a VAX (Digital Equipment Corporation, Maynard, Mass.) or Cray Supercomputer (Cray Research), multiprocessor computers such as those produced by Thinking Machines (Cambridge, Mass.), workstations such as the Sun ULTRASPARC or Sun SPARC (Sun Microsystems, Sunnyvale, Calif.) or Silicon Graphics machines (Silicon Graphics, Mountain View, Calif.), personal computers such as Macintosh computers (Apple Computer, Cupertino, Calif.) or IBM or IBM compatible personal computers.

It should be understood that the present invention also relates to machine readable media on which are stored line layout designs meeting the requirements of this invention, or program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

After step 216, optimization process 112 proceeds to a step 218 to determine whether any conductive lines need to be evaluated. If another conductive line needs evaluation, the process goes back to step 206, where the optimization process is repeated for this conductive line. If, however, there are no other conductive lines that might need evaluation, then the process comes to an end.

Figure 1A:
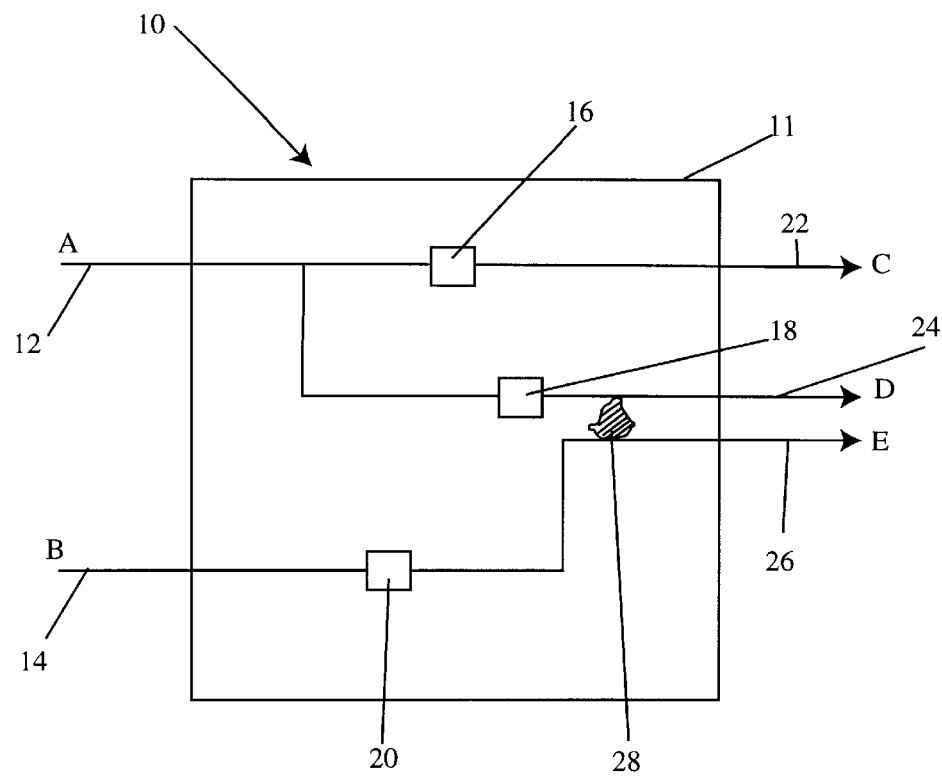
FIG. 1A shows an idealized simple integrated circuit (IC) section containing cells and conductive lines that includes a sensitive area, where the presence of a particle could create a short-circuit in the integrated circuit (IC).
Figure 4A:
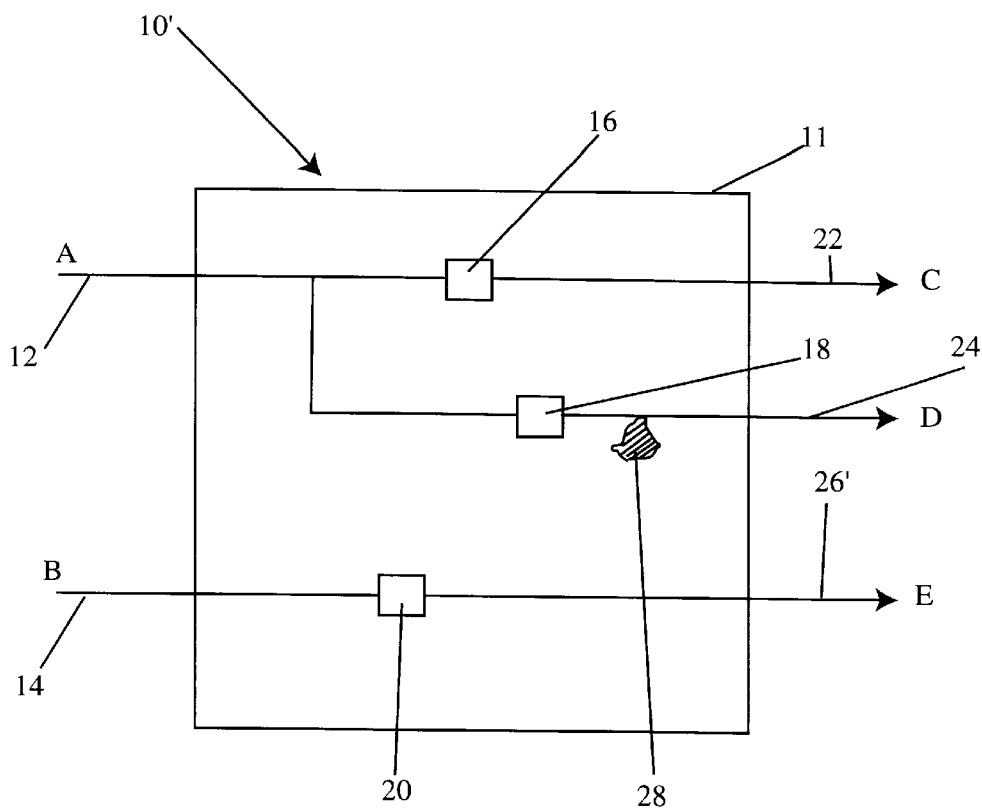
FIG. 4A, for exemplary purposes, shows a modified layout of the conventional layout scheme as shown in FIG. 1A, according to one embodiment of the present invention.

Referring back to step 214, in the embodiment where selected conductive line 26 of FIG. 1A may need to be modified, if the single gap distance is found equal to or less than the predefined minimum gap differential then, according to one embodiment of the present invention, the gap distance is increased to eliminate the sensitive area. By way of example, FIG. 4A shows a modified circuit region 10', according to one embodiment of the present invention, which is similar to region 10 of FIG. 1, except that the layout of conductive line 26' is adjusted to widen the gap between conductive lines 24 and 26'. Of course, such modification is made, while keeping in mind that the adjustment of conductive line 26' does not interfere with any other device or create another sensitive area. The modified configuration of conductive line 26' ensures that the presence of particle 28 does not pose a threat to short-circuit signals D and E, and thereby eliminates a sensitive area.

Figure 1B:
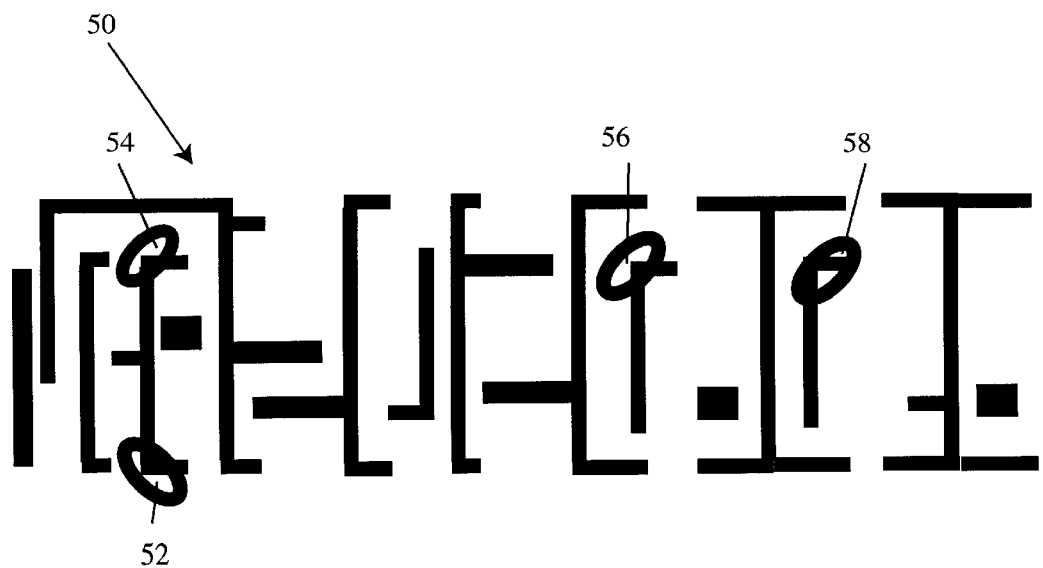
FIG. 1B shows a more detailed example of a conventional wiring layout including sensitive areas that are susceptible to particles.
Figure 4B:
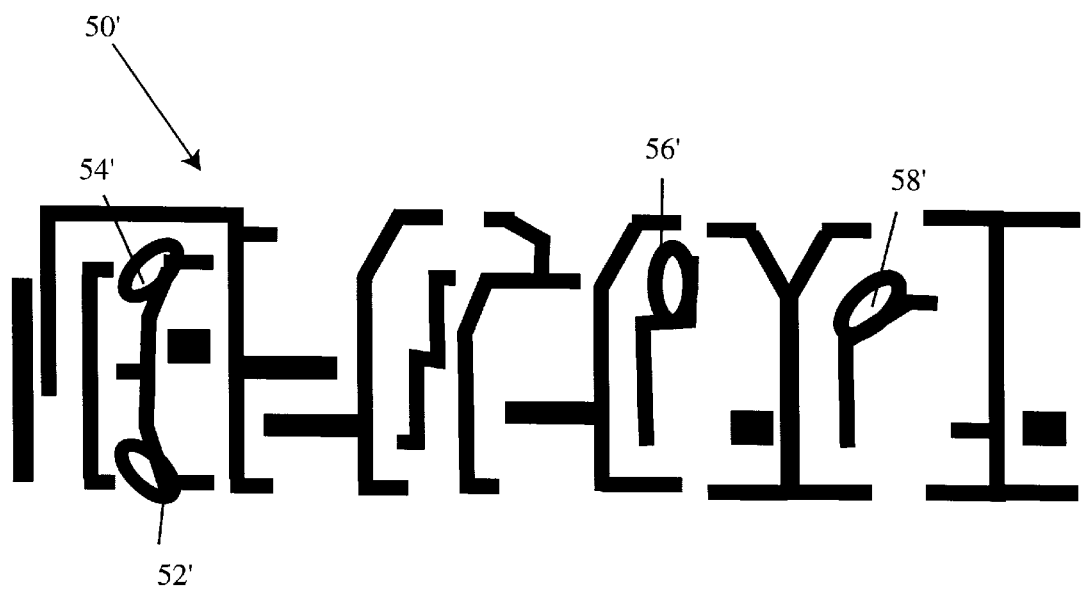
FIG. 4B, for exemplary purposes, shows a modified layout of the conventional layout scheme as shown in FIG. 1B, according to one embodiment of the present invention.

FIG. 4B shows a modified layout scheme 50', according to one embodiment of the present invention, of the conductive lines as shown in FIG. 1B. In modified layout scheme 50', the sharp corners of conductive lines 52, 54 and 58 as shown in FIG. 1B are eliminated and modified conductive lines 52', 54' and 58' are reconfigured to have somewhat rounded corners. In one embodiment of the present invention, conductive lines 52', 54' and 58' curve around the corner at an angle of about 45°, as shown in FIG. 4B. Routing of conductive line 56 of FIG. 1B is also modified such that its sharp corner, which is close to an adjacent conductive line disposed above conductive line 56, is eliminated. The layout of modified conductive lines 52', 54', 56' and 58', as shown in FIG. 4B, positions these conductive lines equidistant from their adjacent conductive lines to ensure that any sensitive areas that are susceptible to particles are eliminated or made less susceptible.

Figure 5A:
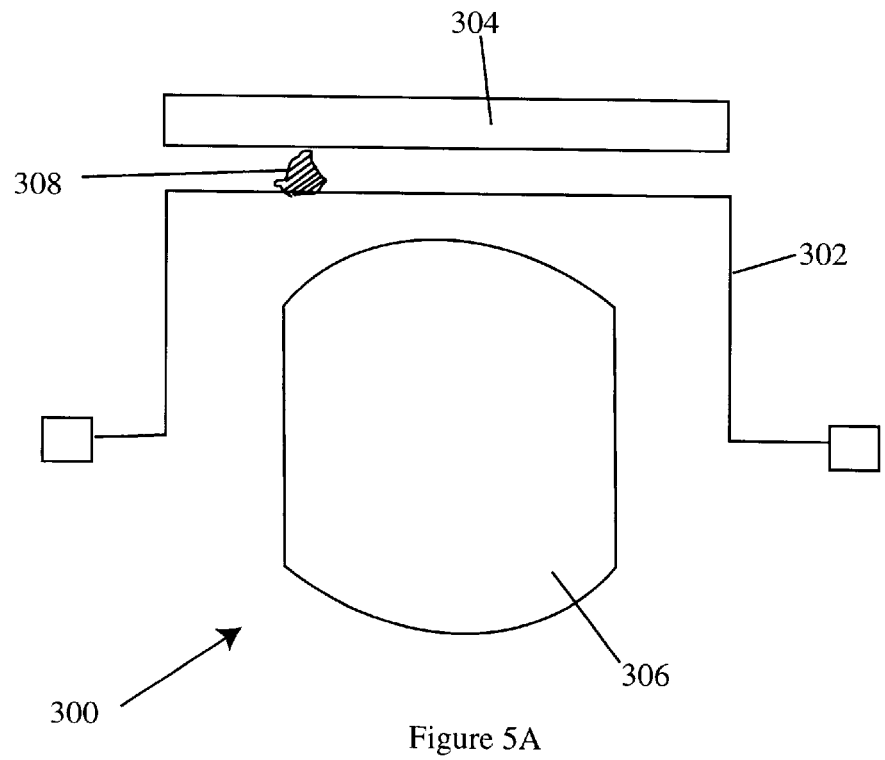
FIG. 5A, for exemplary purposes, shows a conventional layout scheme including a critical path.
Figure 5B:
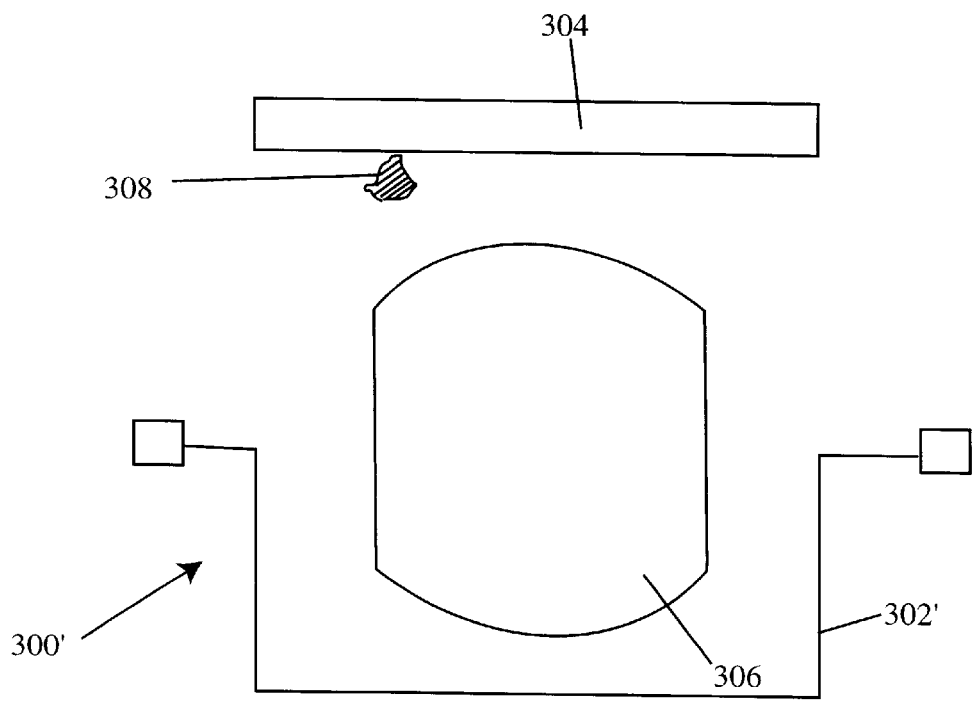
FIG. 5B, for exemplary purposes, shows a modification of the critical path of FIG. 5A, according to one embodiment of the present invention.

While the line routing optimization scheme of this invention will not attempt to reroute lines on critical paths, some critical paths may be susceptible to rerouting. One such example is illustrated in FIGS. 5A and 5B. FIG. 5A shows a conventional IC layout 300, including a conductive line 302, which represents a critical path between two contact points. Conductive line 302, as shown, runs between two conductive features 304 and 306 such that a particle 308 present between conductive line 302 and element 304 would short-circuit the IC. In order to eliminate the sensitive area that is formed between conductive line 302 and element 304, FIG. 5B shows a modified IC layout 300'. In the modified layout 300', conductive line 302' is routed such that it is positioned away from conductive elements 304 and 306, as shown. Consequently, the sensitive area susceptible to particle 308 is eliminated. It is important to note that in its modified configuration, the layout of conductive line 302' maintains the same distance between the contact points as shown in the conventional IC layout. This ensures that there is no performance degradation, e.g., no additional undesirable delay in the signal that is being transmitted through conductive line 302', due to the modification of the critical path according to the present invention.

One skilled in the art may appreciate that there may be a number of ways to reconfigure the layout of conductive lines. FIGS. 4A, 4B and 5 are intended to serve as examples of the modification that can be made to conventional IC layout schemes to minimize the number of sensitive areas, without interfering with another IC feature, creating other sensitive areas, causing a delayed signal, etc.

The present invention represents a marked improvement over the prior art. Optimizing the IC layout, according to the present invention, does not require additional IC space. As mentioned above, in FIG. 4B, for example, the modification of a selected conductive line may involve reducing the gap distance between a selected conductive line and an adjacent conductive line within the same IC space such that the gap distances between the selected conductive line and its adjacent conductive lines are made similar if not equidistant. As further examples, FIGS. 4A and 5 also show modification to a conductive line without requiring additional IC space. It is important to note that conventional design rule checkers decrease the distance between two IC features and force a specific distance between such features. The present invention, however, adjusts the distances between the IC features such that the distance between closely spaced features is increased to eliminate sensitive areas without increasing the overall size of the IC.

Furthermore, optimizing an IC layout in accordance with this invention does not typically impede the IC performance. By way of example, FIG. 5 shows the modification of a critical path that does not introduce any signal delay into the IC because the length of the conductive line carrying the signal remains unchanged. Thus the present invention effectively optimizes the IC layout to minimize the number of sensitive areas susceptible to particles without requiring additional IC space or impeding the IC performance.

Although the foregoing design has been described in some detail for purposes of clarity of understanding, it will be apparent that certain changes and modifications may be practiced within the scope of the appended claims. For example, the optimized layout scheme for intercell connections has been described above in detail, there is in principle no reason why an optimization of a layout scheme for intracell connections cannot be similarly conducted. Therefore, the present embodiments are to be considered as illustrative and not restrictive, and the invention is not to be limited to the details given herein, but may be modified within the scope of the appended claims.

What is claimed is:

1. A process for optimizing the layout of an integrated circuit (IC) design, comprising:
    selecting a segment of a conductive line to be modified, said segment being selected based upon its location between a first line and a second line and being separated from these lines by unequal distances, such that said segment is close enough to said first line such that a sensitive area that is susceptible to damage from particle contamination exists; and
    repositioning said selected segment such that the distance between the segment and the first line is increased and the distance between the segment and the second line is decreased.

2. The process of claim 1, wherein said step of selecting comprises measuring the distance between said segment and said first line and determining whether that distance is less than or equal to a predefined gap differential.

3. The process of claim 1, wherein said step of modifying comprises:
    determining the distances between the segment and the first and second lines;
    determining an absolute value of a difference between the distances; and
    reconfiguring the magnitude of said distances if the absolute value of the difference between said gap distances is greater than or equal to a predefined gap differential.

4. The process of claim 3, wherein said step of reconfiguring comprises reducing the magnitude of larger of said distances by a factor that is one half of said absolute value of said difference between said distances.

5. The process of claim 3, wherein said step of reconfiguring comprises reconfiguring the magnitude of said distances to ensure that said distances are substantially equal to each other.

6. The process of claim 3, wherein said predefined gap differential ranges from between about 0.25 $\mu$m and about 2.0 $\mu$m.

7. The process of claim 6, wherein said predefined gap differential ranges from between about 0.35 $\mu$m and about 2.0 $\mu$m.

8. The process of claim 1, wherein said selected segment of the conductive line is part of a critical path and said step of repositioning comprises modifying said critical path such that there is no additional signal delay.

9. The process of claim 1, wherein said optimization process is carried out in a separate step after a general layout of conductive lines is determined by a routing tool.

10. The process of claim 1, wherein said optimization process is carried out by a routing tool when a general layout of conductive lines is determined.

11. The process of claim 1, further comprising a step of post-layout simulation to verify the design after optimization of conductive lines has concluded.

12. The process of claim 1, wherein said segment forms part of a corner and after said step of modification said segment no longer forms part of a corner.

13. The process of claim 1, wherein said selected segment of the conductive line is part of an intercell conductive layout scheme.

14. The process of claim 1, wherein said selected segment of the conductive line is part of an intracell conductive layout scheme.

15. The process of claim 1, wherein said steps of selecting and repositioning are executed in succession for a plurality of line segments located throughout the entire integrated circuit (IC) design.

16. The process of claim 1, wherein the entire IC design is subjected to said steps of selecting and repositioning at least twice.

17. A process for optimizing the layout of an IC, comprising:
    selecting an IC feature to be modified, said IC feature being located between a first IC feature and a second IC feature such that said selected IC feature is close enough to said first IC feature such that a sensitive area that is susceptible to damage from particle contamination exists; and
    repositioning said selected IC feature such that the second IC feature is between the said selected IC feature and the first IC feature so that the distance between the said selected IC feature and the first IC feature is increased.

18. The process of claim 17, wherein said selected IC feature comprises a segment of conductive line.

19. The process of claim 17, wherein said selected IC feature comprises a cell.

20. The method of claim 17 wherein said first IC feature is a critical path whose length is unchanged by the repositioning.

21. An apparatus for optimizing a layout of an IC design, comprising:

a routing tool to generate said layout scheme of IC features, which has a first IC feature between a second IC feature and a third IC feature and being separated from the second and third IC feature by unequal distances, such that said first IC feature is close enough to the second IC feature such that a sensitive area that is susceptible to damage from particle contamination exists; and an optimizing tool to generate a modified layout scheme, in which said first IC feature is repositioned such that the distance between said first IC feature and said second IC feature is increased and the distance between the first IC feature and the third IC feature is decreased.

22. The apparatus of claim 21, further comprising a post-layout simulator tool to verify said modified layout scheme.

23. The apparatus of claim 21, wherein said optimizing tool is a software tool.

24. The apparatus of claim 21, wherein said routing tool generates said layout scheme of said IC features based on a netlist generated by a design capture tool.

25. The apparatus of claim 24, further comprises a pre-layout simulator tool to verify whether said schematic generated by said design capture tool will perform as intended.

26. The apparatus of claim 21, wherein said routing tool and said optimizing tool are incorporated in a single tool.

27. An apparatus for optimizing a layout of an IC design, comprising:

means for routing to generate said layout scheme of IC features, which has a first IC feature between a second IC feature and a third IC feature and being separated from the second and third IC feature by unequal distances, such that said first IC feature is close enough to said second IC feature such that a sensitive area that is susceptible to damage from particle contamination exists; and means for optimizing to generate a modified layout scheme, in which said first IC feature is repositioned such that the distance between said first IC feature and said second IC feature is increased and the distance between the first IC feature and the third IC feature is decreased.

28. The apparatus of claim 27, wherein said means for optimizing comprises a software tool.

29. The apparatus of claim 27, wherein said means for routing and said means for optimizing are incorporated into one tool.

30. The apparatus of claim 27, further comprising means for post-layout simulation to verify said modified layout scheme.

31. The apparatus of claim 27, wherein said means for routing generates said layout scheme of said IC features based on a schematic generated by a design capture tool.

* * * * *